US007589306B2

(12) United States Patent
Venezia et al.

(10) Patent No.: US 7,589,306 B2
(45) Date of Patent: Sep. 15, 2009

(54) IMAGE SENSOR WITH BURIED SELF ALIGNED FOCUSING ELEMENT

(75) Inventors: Vincent Venezia, Sunnyvale, CA (US); Hsin-Chih Tai, Cupertino, CA (US); Duli Mao, Sunnyvale, CA (US); Wei Dong Qian, Los Gatos, CA (US); Ashish Shah, Milpitas, CA (US); Howard Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/030,055

(22) Filed: Feb. 12, 2008

(65) Prior Publication Data

US 2009/0200452 A1    Aug. 13, 2009

(51) Int. Cl.
  *H01L 27/00*    (2006.01)
  *H01L 31/00*    (2006.01)
  *H01J 5/16*     (2006.01)

(52) U.S. Cl. .................. 250/208.1; 250/216; 250/214.1; 257/432; 257/294; 348/69

(58) Field of Classification Search ............. 250/208.1, 250/216, 214.1; 257/294, 432; 348/69
See application file for complete search history.

(56) References Cited

U.S. PATENT DOCUMENTS

| 4,959,533 | A |   | 9/1990 | Yamazaki et al. |           |
|-----------|---|---|--------|-----------------|-----------|
| 5,091,638 | A |   | 2/1992 | Yamazaki et al. |           |
| 5,187,596 | A |   | 2/1993 | Hwang           |           |
| 5,363,216 | A |   | 11/1994| Kim             |           |
| 6,104,021 | A | * | 8/2000 | Ogawa           | 250/208.1 |
| 6,221,687 | B1| * | 4/2001 | Abramovich      | 438/70    |
| 6,674,061 | B1|   | 1/2004 | Arimoto         |           |
| 7,262,073 | B2|   | 8/2007 | Baek et al.     |           |
| 7,262,448 | B2| * | 8/2007 | Kim             | 257/294   |
| 7,291,826 | B2| * |11/2007 | Vaillant        | 250/214.1 |
| 2001/0010952 | A1 | * | 8/2001 | Abramovich  | 438/151   |
| 2005/0200734 | A1 | * | 9/2005 | Ahn et al.  | 348/311   |
| 2006/0033008 | A1 | * | 2/2006 | Vaillant    | 250/208.1 |
| 2006/0050397 | A1 | * | 3/2006 | Oh et al.   | 359/619   |
| 2006/0145216 | A1 | * | 7/2006 | Lee         | 257/294   |
| 2006/0169870 | A1 | * | 8/2006 | Silsby et al.| 250/208.1|
| 2007/0024926 | A1 |   | 2/2007 | Chung       |           |
| 2007/0035785 | A1 |   | 2/2007 | Kuan        |           |
| 2008/0157142 | A1 | * | 7/2008 | Park        | 257/292   |

OTHER PUBLICATIONS

Rhodes, H. et al, "CMOS Imager Technology Shrinks and Image Performance", Microelectronics and Electron Devices, 2004 IEEE Workshop on, 2004, pp. 7-18, ISBN: 0-7803-8369-9/04.

* cited by examiner

*Primary Examiner*—John R Lee
(74) *Attorney, Agent, or Firm*—Blakely Sokoloff Taylor & Zafman LLP

(57) ABSTRACT

An image sensor includes an optical sensor region, a stack of dielectric and metal layers, and a buried focusing layer. The optical sensor is disposed within a semiconductor substrate. The stack of dielectric and metal layers are disposed on the semiconductor substrate above the optical sensor region. The metal layers include optical pass-throughs aligned to expose an optical path through the stack form a top dielectric layer through to the optical sensor region. The buried focusing layer is disposed over a conforming metal layer of the metal layers within the stack. The buried focusing layer includes a curved surface conformed by the optical pass-through of the conforming metal layer to focus light onto the optical sensor region.

16 Claims, 6 Drawing Sheets

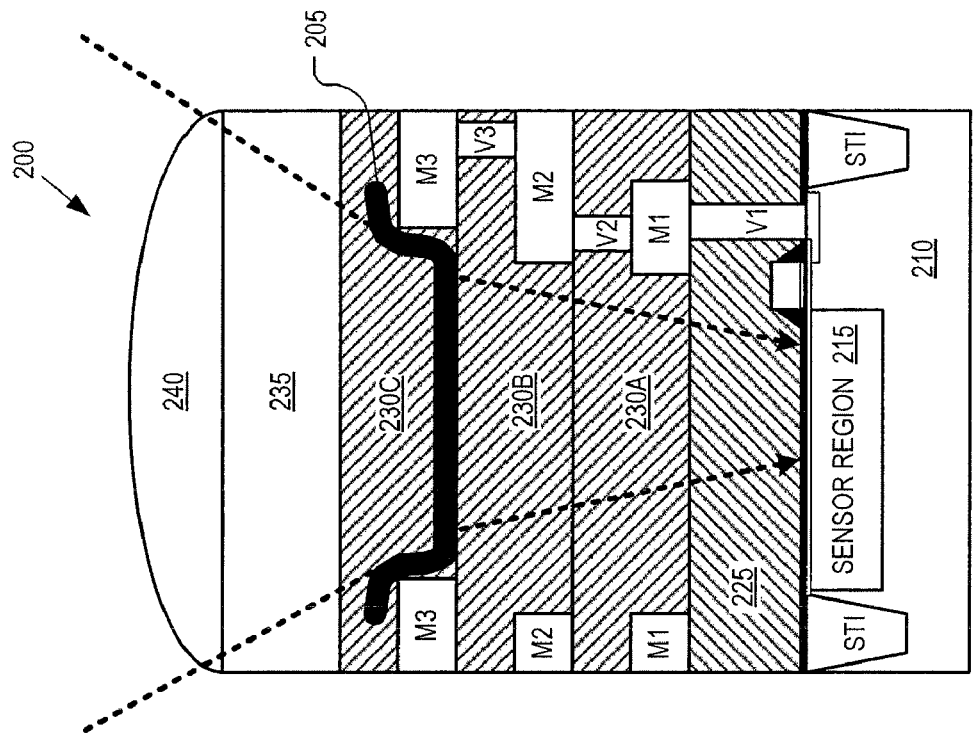
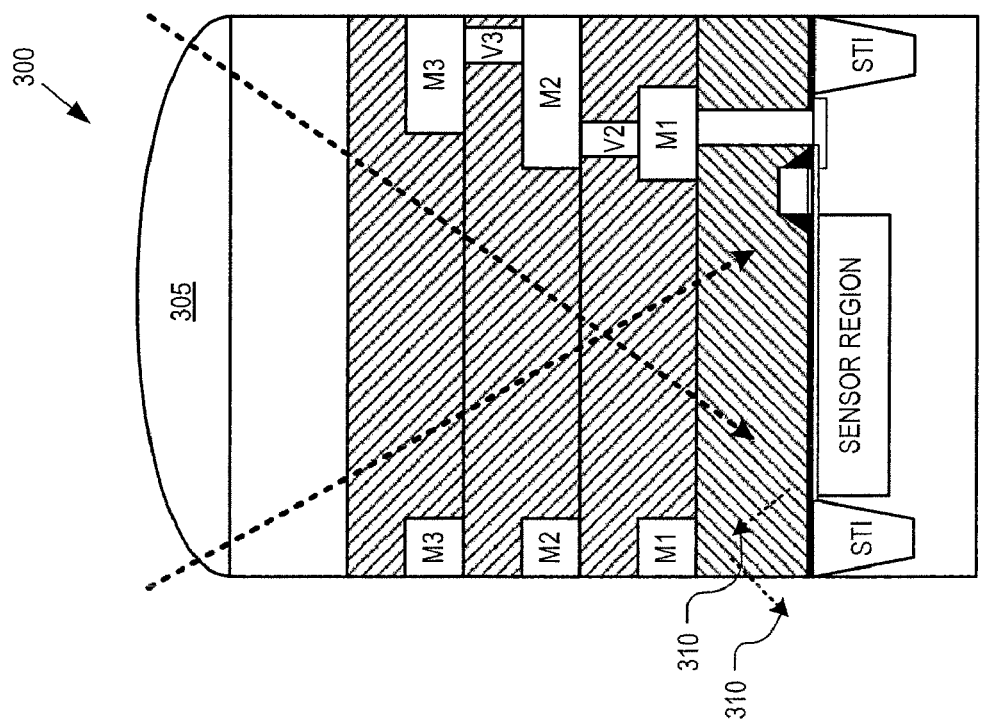
FIG. 3A
FIG. 3B

IMAGE SENSOR WITH BURIED SELF ALIGNED FOCUSING ELEMENT

TECHNICAL FIELD

This disclosure relates generally to image sensors, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors, and in particular, CMOS image sensors ("CIS"), has continued to advance at great pace. For example, the demands of higher resolution and lower power consumption have encouraged the further miniaturization and integration of these image sensors. FIG. 1 illustrates a conventional CIS module 100. CIS module 100 operates by illuminating object 105 with light sources 110 (e.g., multicolor LEDs). The light reflected off object 105 is focused onto a CIS array 115, which includes a two dimensional array of optical sensors. Once the impinging image is captured, pixel array 115 outputs analog image data 120 to a digital processing unit 125. Digital processing unit 125 includes analog-to-digital ("ADC") circuitry to convert analog image data 120 to digital image data 130. Finally, digital image data 130 may be subsequently stored, transmitted, or otherwise manipulated by software/firmware logic 135.

As the process technology for fabricating CIS array 115 continues to advance into sub 2.2 micron pixel designs, focusing light into the individual photodiodes of CIS array 115 and reducing crosstalk between the pixels has become increasingly difficult. This difficultly arises due to the relatively small open metal area above each photodiode in CIS array 115. Conventional techniques for increasing the sensitivity and reducing cross talk include shrinking the height of the back end metal stack (metal and dielectric layers) above the photodiode and/or incorporating an embedded microlens. The metal stack height, including the intermetal dielectric layers, is constrained by the capacitive coupling of consecutive metal layers. This coupling adversely affects circuit timing and gain. Therefore reducing the metal stack height to increase sensitivity can negatively affect many aspects of CIS performance. Using an embedded microlens, that is, a microlens below the traditional top microlens in the inter-metal dielectric layers, adds significant process complexity. For instance, the top microlens is formed of polyimides, which cannot withstand the typical processing temperatures used during the deposition of the metal stack layers and therefore cannot be used to fabricate embedded microlenses. In addition, alignment of an embedded microlens to the top microlens and to the surface of the photodiode is difficult and increases in difficulty as the photodiode apertures continue to decrease in sub 2.2 micron CIS technology.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 3A is a cross sectional view of a CIS without a buried SAFE illustrating how impinging light is focused above the sensor region.

FIG. 3B is a cross sectional view of a CIS with buried SAFE illustrating how impinging light refocused by the buried SAFE onto the sensor region, in accordance with an embodiment of the invention.

DETAILED DESCRIPTION

Embodiments of a complementary metal-oxide-semiconductor ("CMOS") image sensor ("CIS") with a buried self aligned focusing element ("SAFE") are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
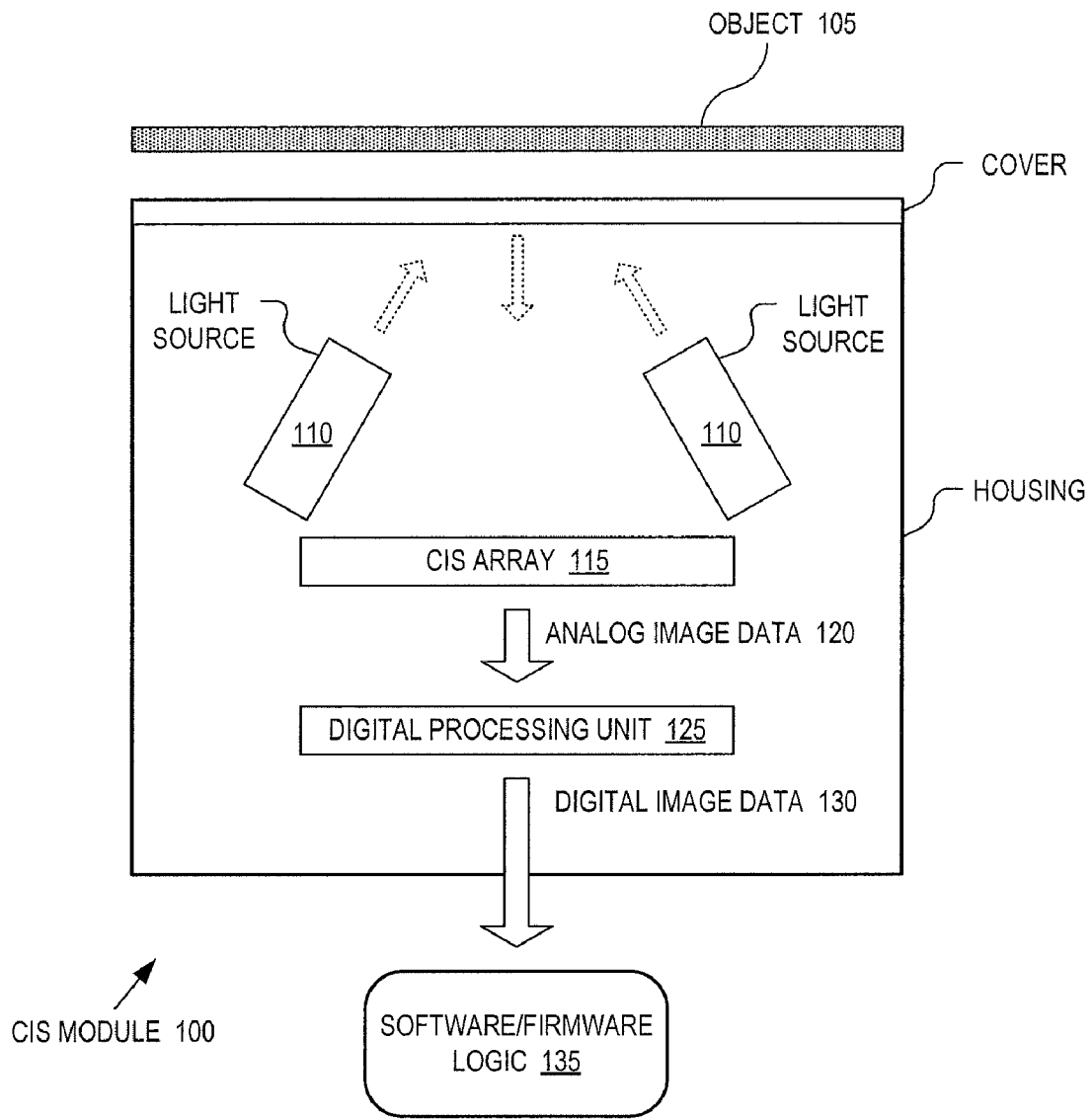
FIG. 1 is a functional block diagram illustrating a conventional CMOS image sensor ("CIS").
Figure 2:
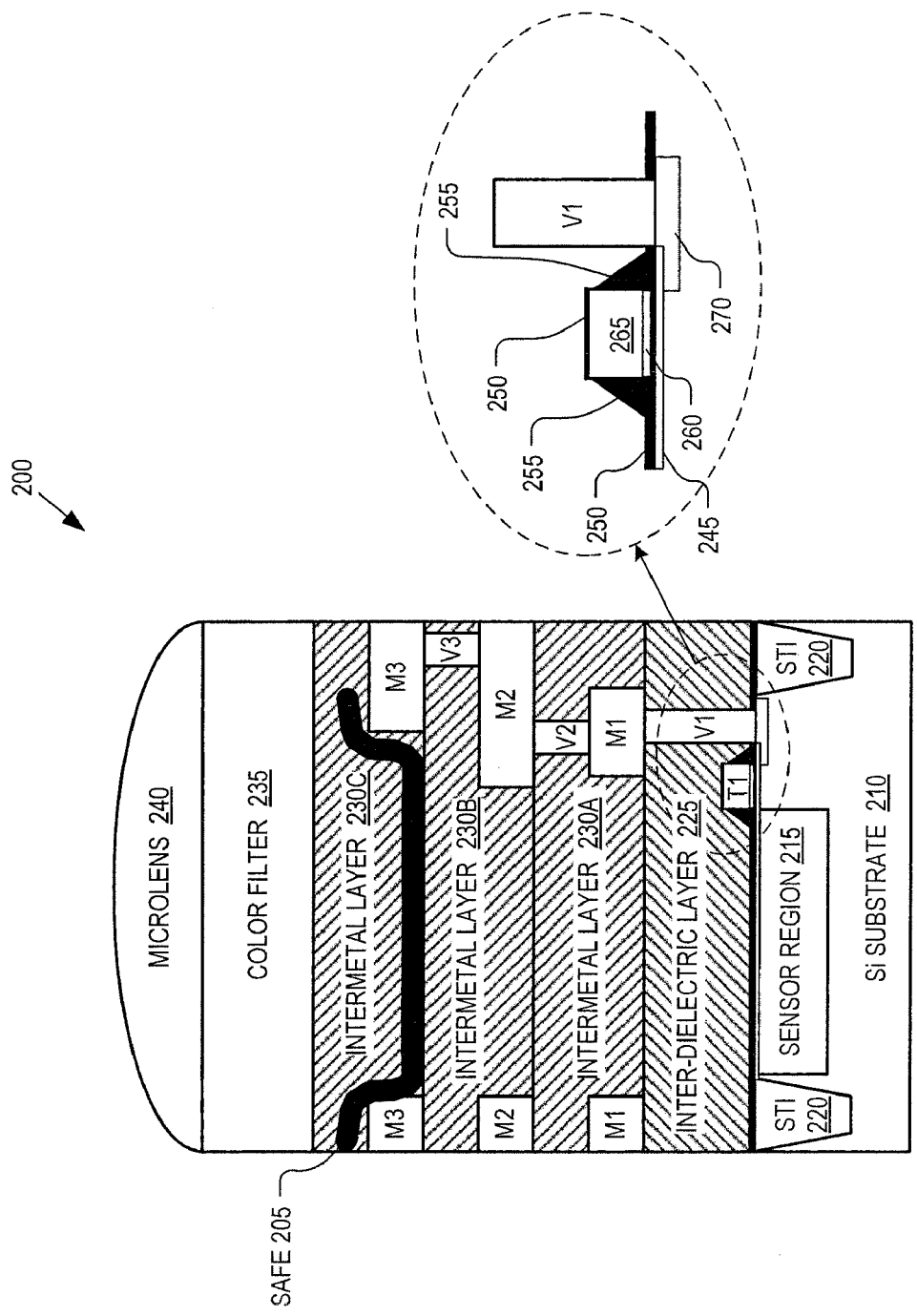
FIG. 2 is a cross sectional view of a CIS with buried self aligned focusing element ("SAFE"), in accordance with an embodiment of the invention.

FIG. 2 is a cross sectional view of a CIS 200 with a buried self aligned focusing element ("SAFE"), in accordance with an embodiment of the invention. The illustrated embodiment of CIS 200 includes a SAFE 205, a semiconductor substrate 210, an optical sensor region 215, shallow trench isolations ("STIs") 220, a transfer transistor T1, metal vias V1, V2, and V3, inter-dielectic layer 225, inter-metal dielectric layers 230A, 230B, and 230C, metal layers M1, M2, and M3, color filter 235, and microlens 240. The illustrated embodiment of transfer transistor T1 includes a pinning or surface passivation layer 245, an oxide silicide blocking layer 250, oxide spacers 255, a gate oxide 260, a gate electrode 265, and a diffusion region 270.

As the pixel size of CIS continue to scale below 2.2 Mm, focusing light into optical sensor region 215 is increasingly difficult. This is due to the relatively narrow optical pass-throughs in each metal layer that form an optical path through the metal stack (e.g., inter-metal dielectric layers 230, inter-dielectric layer 225, and metal layers M1-M3) down to the surface of optical sensor region 215. The metal stack can be greater than 4 µm high, while the diameter of the optical pass-throughs can be less than 1.5 µm wide. As such, microlens 240 alone may not be sufficient to optimally focus incident light onto the surface of optical sensor region 215. Conventional CIS have attempted to address this by removing metal layers to reduce the metal stack height. However, removing metal layers limits the transistor count of the image sensor and forces metal layer M3 circuitry to be moved to metal layer M2. This can crowd metal layer M2, causing metal layer M2 to further encroach on the optical path.

FIG. 3A illustrates a CIS 300 without a buried focusing element. As illustrated, the incident light tends to be focused at a point above the surface of the optical sensor region. As the light continues deeper into CIS 300 past the focal point of microlens 305, it begins to diverge. The divergent or out-of-focus light reduces the sensitivity of CIS 300 and increases cross-talk between adjacent pixels in an array of CIS 300. The reduced sensitivity is a result of the intensity reduction that occurs as the incident light diverges past the focal length of microlens 305. The greater the degree of blurriness or malfocus, the lower the intensity of the light striking the optical sensor region. To aggravate matters, as the light diverges, its angle of incidence with the dielectric layers of the metal stack (as measured from a surface's normal) increases, resulting in a greater portion of the light being reflected at refractive boundaries between the dielectric layers within CIS 300. This reflected light can even bounce off the metal layers M1, M2, or M3 into adjacent pixels, as illustrated by reflected light 310. Reflected light results in detrimental cross-talk between pixels of a CIS array.

In contrast, CIS 200 includes a buried SAFE 205 to better focus light incident on CIS 200 and improve the optical efficiency of the device. As illustrated in FIG. 3B, SAFE 205 extends the focal length of microlens 240. Light penetrating the optical path between metal layers M1, M2, and M3 maintains its intensity deeper into metal the stack, thereby increasing the sensitivity of CIS 200. Furthermore, since the light does not diverge within the optical path, reflections are reduced and crosstalk between adjacent pixels diminished. By burying one or more SAFEs 205 into the metal stack, higher stacks with greater numbers of metal layers can be used, while maintaining CIS sensitivity. Increasing the number of metal layers can enable higher resolution pixel arrays and higher transistor count image sensors (e.g., 4 transistor, 5 transistor, or higher).

Returning to FIG. 2, embodiments of CIS 200 are fabricated with the following materials. In one embodiment, semiconductor substrate 210 is a silicon substrate while diffusion region 270 and optical sensor region 215 are N-type doped. Optical sensor region 215 may be formed using a variety of photosensitive structures, such as a photodiode. Optical sensor region 215 and transfer transistor T1 include oxide insulating layers, such as oxide silicide blocking layer 250, oxide spacers 255, and gate oxide 260. Vias V1-V3 conductively link metal layers M1-M3 and may be fabricated of a variety of metals, including tungsten. Metal layers M1-M3 (approx 5000 angstroms thick) may also be fabricated of a variety of metals, including aluminum. Each dielectric layer within the metal stack may be formed of a deposited oxide (e.g., silicon oxide) approximately 1 µm thick, for a total metal stack height of approximately 4 µm thick. SAFE 205 may be fabricated of a material having a higher index of refraction than its surrounding dielectric layers, such as silicon nitride, silicon oxynitride, silicon germanium, other high index polyimides, or otherwise. In one embodiment, SAFE 205 is approximately 500 to 2000 angstroms thick. Color filter 235 may be a color sensitive organic polyimide, while microlens 240 may be fabricated of a clear polyimide material.

It should be appreciated that FIG. 2 is merely intended as illustrative and not necessarily drawn to scale. Furthermore, the materials and dimensions disclosed above are not intended to be an exhaustive list of alternatives nor a listing of exclusive fabrication materials. Rather, one of ordinary skill having the benefit of the instant disclosure will appreciate that various substitute materials and/or alternative dimensions may be implemented.

Figure 4:
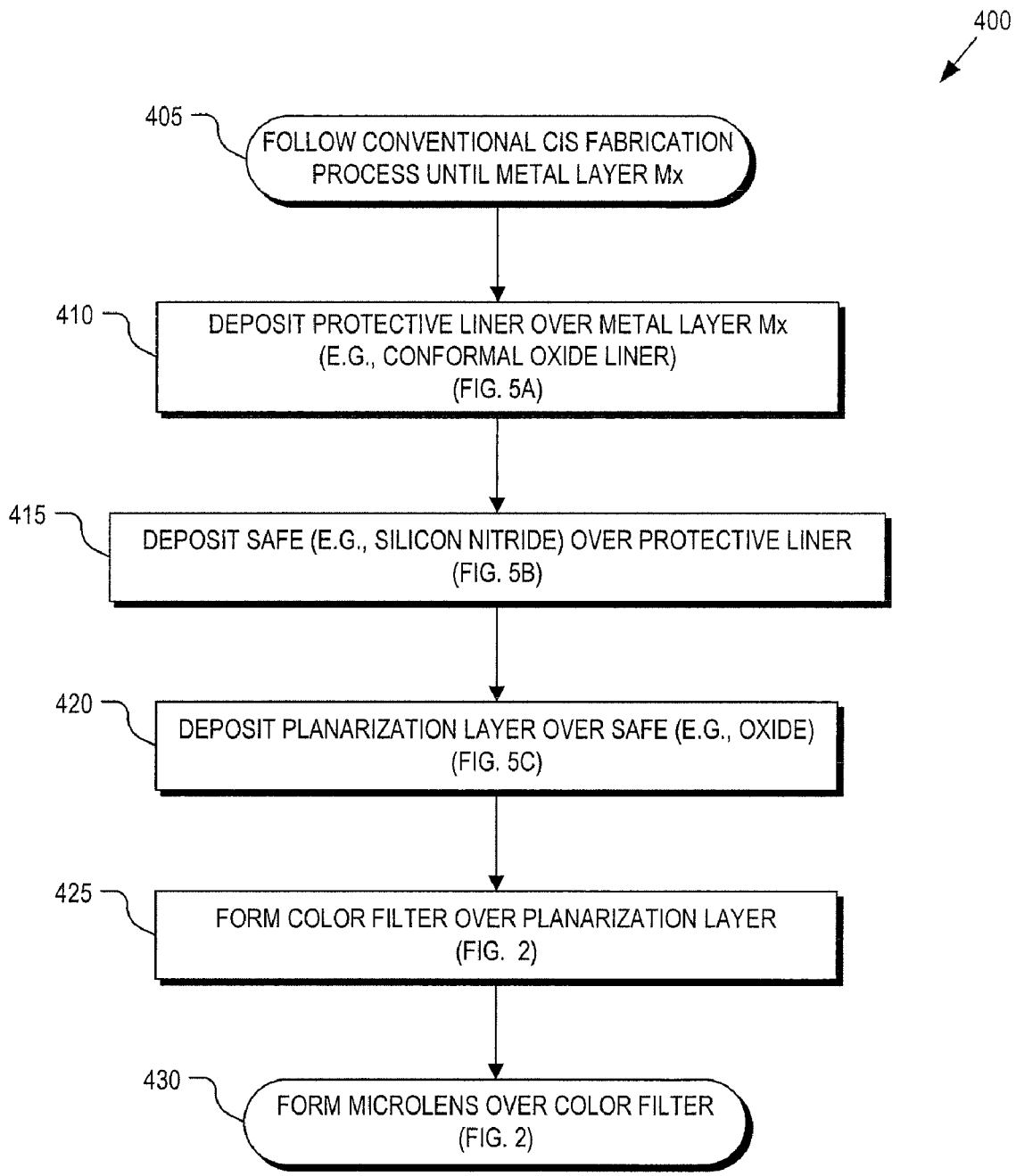
FIG. 4 is a flow chart illustrating a process for fabricating a CIS with buried SAFE, in accordance with an embodiment of the invention.

FIG. 4 is a flow chart illustrating a process 400 for fabricating CIS 200, in accordance with an embodiment of the invention. The order in which some or all of the process blocks appear in process 400 should not be deemed limiting. Rather, one of ordinary skill in the art having the benefit of the present disclosure will understand that some of the process blocks may be executed in a variety of orders not illustrated, or even left out entirely.

Figure 5C:
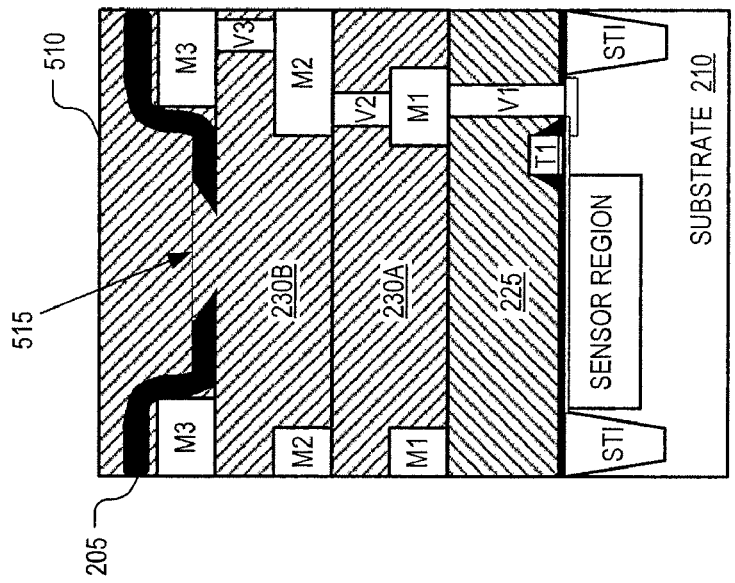
FIGS. 5A-C illustrate various intermediate fabrication steps of a CIS with buried SAFE, in accordance with an embodiment of the invention.

The fabrication of CIS 200 follows conventional fabrication until the first metal layer Mx upon which SAFE 200 is disposed. In the illustrated embodiment, SAFE 200 is disposed on the top metal layer M3; however, it should be appreciated that SAFE 200 may be disposed over lower metal layers (e.g., M2 or M1) and multiple SAFE 200 may even be included within a single metal stack. As illustrated in FIG. 5A, the initial fabrication processes may include forming optical sensor region 215 between STIs 220 within substrate 210. Subsequently, transfer transistor T1 is formed to couple optical sensor region 215 to via V1 through diffusion region 270. Inter-dielectric layer 225 is the first dielectric layer of the metal stack disposed over optical sensor region 215. Once deposited, via V1 is etched and backfilled with metal, and then the higher inter-metal dielectric layers 230 and metal layers M1, M2, and M3 are deposited and etched in an iterative manner to build up the constituent layers of the metal stack. Each metal layer is patterned to form optical pass-throughs aligned with optical sensor region 215 to expose an optical path through the metal stack from the top dielectric layer down to optical sensor region 215. In one embodiment, the optical pass-throughs are approximately 1.5 µm to 1.6 µm in diameter. Of course, other diameters may also be implemented. When metal layer Mx (the metal layer upon which SAFE 200 is to be formed) is reached, fabrication of CIS 200 diverges from conventional techniques. However, it should also be appreciated that embodiments of the present invention enable smaller pixel designs with a greater number of metal layers than conventional CIS techniques when one or more SAFEs are buried within the metal stack.

In a process block 410, a protective liner 505 is deposited over metal layer Mx (illustrated as metal layer M3). In one embodiment, protective liner 505 is a conformal oxide liner that conforms to the topography of the patterned metal layer Mx below it. Since the topography of metal layer Mx shapes protective liner 505, metal layer Mx (and any other metal layer that resides immediately below a buried focusing element, such as SAFE 200) is referred to as the "conforming metal layer."

Figure 5B:
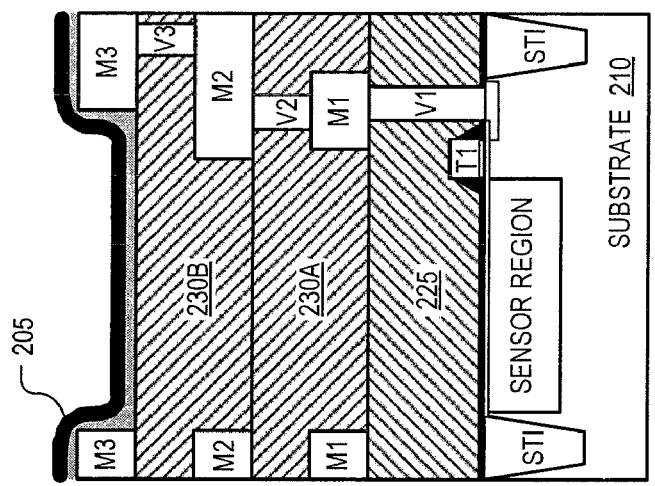
Figure 5A:
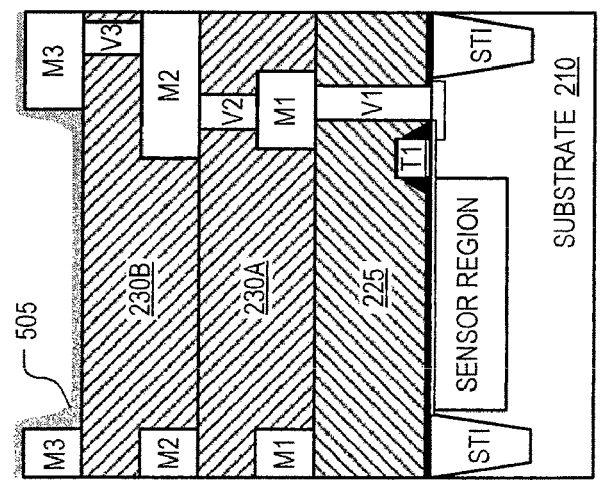

In a process block 415, SAFE 200 is deposited over protective liner 505 (see FIG. 5B). Since protective liner 505 is a relatively thin layer that conforms to the conforming metal layer M3, SAFE 205 is also self aligned to the conforming metal layer M3. When SAFE 205 is deposited, a curved surface or lens is formed in the optical path and self aligns to the optical pass-through of the conforming metal layer M3. Protective liner 505 may also be used as an additional degree of freedom to manipulate the lens characteristics of SAFE 205. For example, the thickness of protective liner 505 will affect the shape and degree of curvature of SAFE 205. Other mechanisms for shaping SAFE 205 include the height of the conforming metal layer M3, the amount of over etch between metal lines, and the thickness of SAFE 205 itself. Accordingly, neither intricate processes nor active alignment is necessary to form and align the lens forming curvature of SAFE 205. The optical characteristics of SAFE 205, including its curvature, can be optimized for a given architecture, application, pixel dimension, and metal stack height.

In a process block 420, a planarization layer 510 is deposited over SAFE 205. In one embodiment, planarization layer 510 is simply the continuation of intermetal dielectric layer 230C. In a process block 425, color filter 235 is disposed over planarization layer 510. In a process block 430, microlens 240 is formed over color filter 235 on the top surface of CIS 200 (see FIG. 2).

In one embodiment, SAFE 205 may remain a blanket high index layer embedded in the dielectric stack, which conforms to its underlying conforming metal layer. In this embodiment, SAFE 205 may operate as a dual purpose layer to act as both a buried focusing element within the optical path and as a passivation blanket layer over the conforming metal layer. In one embodiment, SAFE 205 may be patterned or etched to remove portions that fall outside of the optical path or optical pass-through of its conforming metal layer. In yet another embodiment, SAFE 205 may optionally be etched in a middle portion 515, to enable further lens shaping flexibility (see FIG. 5C).

Figure 6C:
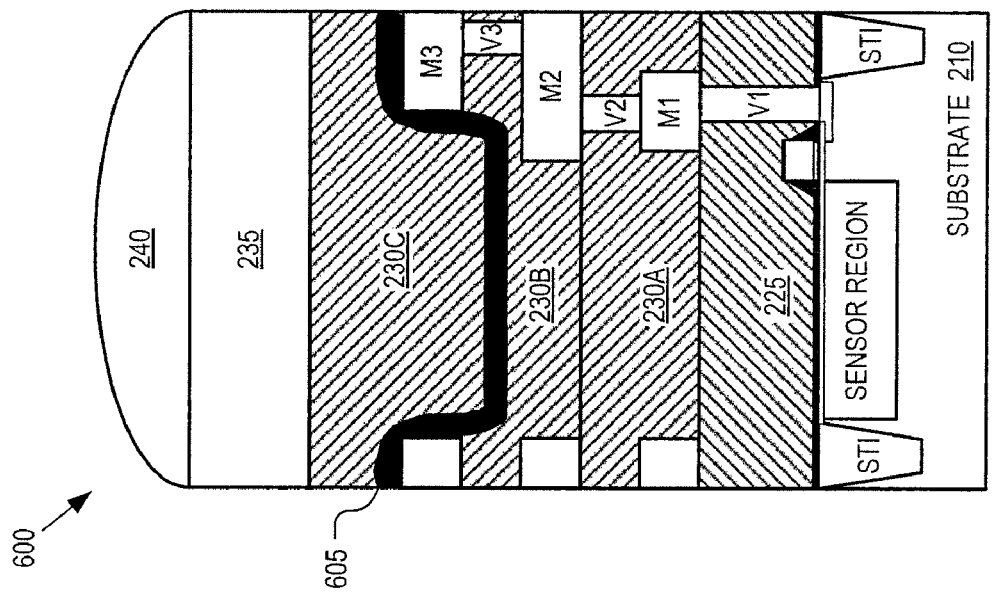
FIGS. 6A-C illustrate various intermediate fabrication steps of a CIS having a deep buried SAFE, in accordance with an embodiment of the invention.
Figure 6B:
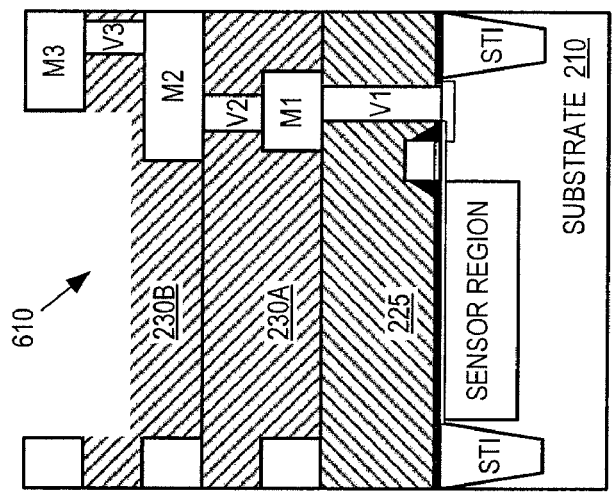
Figure 6A:
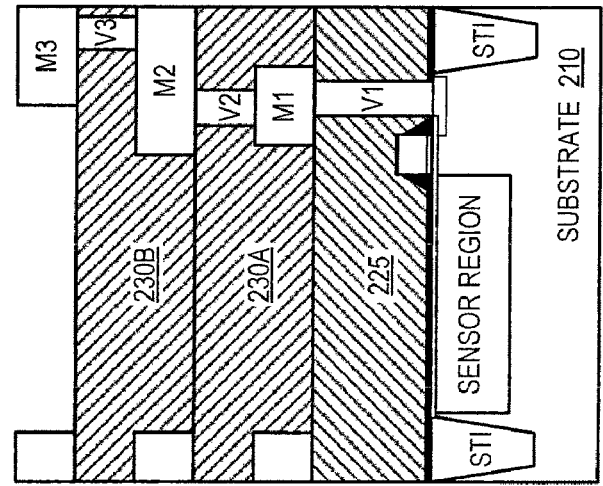

FIGS. 6A-6C illustrate the fabrication of an alternative embodiment of a CIS 600 including a variable depth SAFE 605. The variable depth SAFE 605 enables SAFE 605 to be buried below its conforming metal layer and provides an additional degree of freedom to define its shape to improve CIS sensitivity and reduce crosstalk between adjacent pixels.

Referring to FIG. 6A, fabrication of CIS 600 again follows conventional CIS fabrications processes up to metal layer Mx (the conforming metal layer). At this point, using the conforming metal layer as a mask, a trench 610 is etched into the intermetal dielectric layer (illustrated as inter-metal dielectric layer 230B) upon which the conforming metal layer is disposed and extends below the conforming metal layer (see FIG. 6B). Subsequently, a protective liner, SAFE 605, a planarization layer (e.g., intermetal dielectric layer 230C), color filter 235, and microlens 240 are formed over the conforming metal layer and trench 610 (similar to process 400), as illustrated in FIG. 6C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor, comprising:
    an optical sensor region disposed within a semiconductor substrate;
    a stack of dielectric layers and metal layers disposed on the semiconductor substrate above the optical sensor region, wherein the metal layers include optical pass-throughs aligned to expose an optical path through the stack from a top dielectric layer through to the optical sensor region; and
    a buried focusing element disposed over a conforming metal layer of the metal layers within the stack, the buried focusing element having a curved surface conformed by the optical pass-through of the conforming metal layer to focus light onto the optical sensor region.

2. The image sensor of claim 1, further comprising a microlens disposed above the buried focusing element in alignment with the optical path, the microlens configured to focus light onto the optical sensor region in conjunction with the buried focusing element.

3. The image sensor of claim 2, wherein the buried focusing element has a higher index of refraction than surrounding dielectric layers within the stack.

4. The image sensor of claim 3, wherein the buried focusing element comprises a silicon nitride layer.

5. The image sensor of claim 2, wherein the image sensor comprises a complementary metal-oxide-semiconductor ("CMOS") image sensor, the CMOS image sensor further comprising a color filter disposed between the microlens and the stack.

6. The image sensor of claim 5, wherein the semiconductor substrate comprises a silicon semiconductor substrate and wherein the stack comprises an inter-dielectric layer disposed over the optical sensor region and a plurality of intermetal dielectric layers separating the metal layers disposed over the inter-dielectric layer.

7. The image sensor of claim 1, wherein the buried focusing element comprises a first buried focusing element, the image sensor further comprising a second buried focusing element disposed within the stack between the first buried focusing element and the photo sensor region, wherein the first buried focusing element focuses light onto the photo sensor region in conjunction with the second buried focusing element.

8. The image sensor of claim 1, wherein the stack of intermetal dielectric layers and metal layers includes three vertical metal layers.

9. A method of fabricating a complementary metal-oxide-semiconductor ("CMOS") image sensor, comprising:
    forming an optical sensor region within a semiconductor substrate;
    forming a stack of dielectric layers and metal layers above the optical sensor region, wherein the metal layers include optical pass-throughs aligned to expose an optical path through the stack from a top dielectric layer through to the optical sensor region; and
    forming a buried focusing layer over a conforming metal layer of the metal layers within the stack, the buried focusing layer having a curved surface conformed by the optical pass-through of the conforming metal layer to focus light onto the optical sensor.

10. The method of claim 9, wherein the buried focusing layer has a higher index of refraction than surrounding dielectric layers within the stack.

11. The method of claim 10, wherein the buried focusing layer comprises a layer of silicon nitride.

12. The method of claim 10, further comprising:
    forming a color filter layer above the stack; and
    forming a microlens above the color filter layer aligned with the optical path and configured to focus light on the optical sensor region in conjunction with the buried focusing layer.

13. The method of claim 10, wherein the stack of dielectric and metal layers comprises an inter-dielectric layer disposed over the optical sensor region and a plurality of intermetal dielectric layers separating the plurality of metal layers disposed over the inter-dielectric layer.

14. The method of claim 13, wherein forming the buried focusing layer comprises:
   depositing a conformal oxide liner over an exposed one of the metal layers;
   depositing the buried focusing layer over the conformal oxide liner; and
   depositing a planarization layer over the buried focusing layer.

15. The method of claim 14, wherein forming the buried focusing layer further comprises:
   etching a trench in an exposed one of the intermetal dielectric layers; and
   depositing the conformal oxide liner over the exposed one of the metal layers and over the trench.

16. The method of claim 10, further comprising etching a middle portion of the buried focusing layer residing within the optical path.

* * * * *